(12) United States Patent
Collins et al.

(10) Patent No.: US 10,490,597 B1
(45) Date of Patent: Nov. 26, 2019

(54) PIXEL ARRAY OF ULTRAVIOLET LIGHT EMITTING DEVICES

(71) Applicant: RayVio Corporation, Hayward, CA (US)

(72) Inventors: Douglas A. Collins, Hayward, CA (US); Li Zhang, San Ramon, CA (US); Faisal Sudradjat, Alameda, CA (US)

(73) Assignee: RayVio Corporation, Hayward, CA (US)

( * ) Notice: Subject to any disclaimer, the term of this patent is extended or adjusted under 35 U.S.C. 154(b) by 0 days.

(21) Appl. No.: 15/261,806

(22) Filed: Sep. 9, 2016

Related U.S. Application Data (63) Continuation of application No. 14/662,620, filed on Mar. 19, 2015, now Pat. No. 9,455,300, which is a continuation of application No. 14/635,903, filed on Mar. 2, 2015, now abandoned.

(51) Int. Cl.
| | | |
|---|---|---|
| *H01L 27/15* | (2006.01) | |
| *H01L 33/20* | (2010.01) | |
| *H01L 33/24* | (2010.01) | |
| *H01L 33/48* | (2010.01) | |
| *H01L 33/62* | (2010.01) | |
| *H01L 33/32* | (2010.01) | |

(52) U.S. Cl.
CPC ............ *H01L 27/156* (2013.01); *H01L 33/20* (2013.01); *H01L 33/24* (2013.01); *H01L 33/32* (2013.01); *H01L 33/486* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 7,411,220 B2 | 8/2008 | Horio et al. | |
| 8,354,663 B2 | 1/2013 | Adivarahan et al. | |
| 9,287,464 B2 | 3/2016 | Saito et al. | |
| 2004/0206970 A1 | 10/2004 | Martin | |
| 2005/0281303 A1* | 12/2005 | Horio | H01L 33/08 372/44.01 |

(Continued)

OTHER PUBLICATIONS

V. Adivarahan et al., High-power deep ultraviolet light-emitting diodes based on a micro-pixel design, Applied Physics Letters, Sep. 6, 2004, pp. 1838 to 1840, vol. 85—No. 10, AIP Publishing, <http://dx.doi.org/10.1063/1.1784882>.

(Continued)

*Primary Examiner* — Walter H Swanson
*Assistant Examiner* — Kien C Ly
(74) *Attorney, Agent, or Firm* — Patent Law Group LLP; Brian D. Ogonowsky (57) ABSTRACT

Embodiments of the invention include a first semiconductor layer grown over a growth substrate and a plurality of pixels grown on the first semiconductor layer, each pixel including an active layer disposed between an n-type region and a p-type region. Trenches isolate individual pixels and form at least one sidewall for each pixel. A first metal layer in direct contact with the p-type region is disposed on a top surface of each pixel. A second metal layer in direct contact with the n-type region is disposed on a bottom surface of a trench adjacent to each pixel. An insulating layer electrically isolating the first and second metal layers is disposed on the sidewall of each pixel and is substantially conformal to the sidewall.

20 Claims, 4 Drawing Sheets

(56) References Cited

U.S. PATENT DOCUMENTS

| | | | |
|---|---|---|---|
| 2006/0231852 A1* | 10/2006 | Kususe | H01L 24/06 257/99 |
| 2009/0302338 A1* | 12/2009 | Nagai | H01L 33/54 257/98 |
| 2010/0059733 A1* | 3/2010 | Shei | H01L 27/156 257/13 |
| 2010/0314642 A1 | 12/2010 | Kudo et al. | |
| 2011/0254035 A1* | 10/2011 | Kim | H01L 33/382 257/98 |
| 2012/0049225 A1* | 3/2012 | Wakaki | H01L 33/44 257/98 |
| 2012/0168809 A1 | 7/2012 | Maute et al. | |
| 2013/0001634 A1 | 1/2013 | Fudeta et al. | |
| 2015/0146749 A1* | 5/2015 | Hoshino | H01S 5/02476 372/36 |
| 2016/0013388 A1* | 1/2016 | Lee | H01L 27/156 257/13 |

OTHER PUBLICATIONS

Shuai Wu et al., Micro-pixel Design Milliwatt Power 254 nm Emission Light Emitting Diodes, Japanese Journal of Applied Physics, Jul. 16, 2004, pp. L 1035-L 1037, vol. 43—No. 8A, The Japan Society of Applied Physics, <http://iopscience.iop.org/1347-4065/43/8A/L1035>.

Seongmo Hwang et al., A Hybrid Micro-Pixel Based Deep Ultraviolet Light-Emitting Diode Lamp, Applied Physics Express, Dec. 16, 2010, pp. 012102-1 to 012102-3, vol. 4—Issue 1, The Japan Society of Applied Physics, <http://iopscience.iop.org/1882-0786/4/1/012102;jsessionid=BAB29DD495EF671AB7FFC69EE69D8EF6.c3>.

Asif Khan et al., Ultraviolet light-emitting diodes based on group three nitrides, Nature Photonics, Feb. 2008, pp. 77 to 84, vol. 2, Nature Publishing Group, <http://www.nature.com/nphoton/journal/v2/n2/full/nphoton.2007.293.html>.

* cited by examiner

PIXEL ARRAY OF ULTRAVIOLET LIGHT EMITTING DEVICES

CROSS-REFERENCE TO RELATED APPLICATION

This application is a continuation of U.S. application Ser. No. 14/662,620, titled "Pixel Array of Ultraviolet Light Emitting Devices," filed Mar. 19, 2015 by Douglas A. Collins et al., which is a continuation of U.S. application Ser. No. 14/635,903, filed Mar. 2, 2015 by Douglas A. Collins et al. Both Ser. Nos. 14/662,620 and 14/635,903 are incorporated herein by reference.

BACKGROUND

Description of Related Art

The bandgap of III-nitride materials, including (Al, Ga, In)—N and their alloys, extends from the very narrow gap of InN (0.7 eV) to the very wide gap of AlN (6.2 eV), making III-nitride materials highly suitable for optoelectronic applications such as light emitting diodes (LEDs), laser diodes, optical modulators, and detectors over a wide spectral range extending from the near infrared to the deep ultraviolet. Visible light LEDs and lasers can be obtained using InGaN in the active layers, while ultraviolet (UV) LEDs and lasers require the larger bandgap of AlGaN.

Visible spectrum LEDs based on InGaN and AlInGaP systems have reached maturity and are now in mass production. However, the development of UV LEDs is still hampered by a number of difficulties involving basic material properties of AlGaN alloys, especially those with high Al content. Compared to LEDs in the visible spectral range with external quantum efficiency (EQE, the ratio of extracted photons to injected electron-hole pairs) of more than 50%, deep UV LEDs, such as those emitting below 300 nm, have an EQE of only up to 1%.

UV LEDs with emission wavelengths in the range of 230-350 nm are expected to find a wide range of applications, most of which are based on the interaction between UV radiation and biological material [Khan et al., 2008]. Typical applications include surface sterilization, water purification, medical devices and biochemistry, light sources for ultra-high density optical recording, white lighting, fluorescence analysis, sensing, and zero-emission automobiles. Although under extensive research for many years, UV LEDs, especially those emitting below 300 nm, remain extremely inefficient when compared to their blue and green counterparts. For example, Hirayama et al. recently reported 10.5 mW single-chip LED operation at 282 nm and peak EQE of 1.2% [Hirayama et al., 2009].

Poor current spreading has been one of the major stumbling blocks to obtaining high efficiency deep UV LEDs, due to difficulties in achieving highly conductive yet sufficiently thick n-type AlGaN bottom cladding layers with high Al content. In 2004, Adivarahan et al. proposed a "micro-pixel" LED. The device consists of a 10×10 micro-pixel LED array, with each pixel being a circular mesa of diameter 26 μm. The total physical dimension of the device is 500 μm×500 μm. Since the lateral distance for electron migration before its recombination with a hole is significantly reduced using such geometry, the differential resistance of the device is lowered to 9.8Ω, as compared to standard square geometry LEDs based on the same epitaxial layers with differential resistances from 40 to 14.4Ω [Adivarahan et al., 2004]. Also in 2004, Kim et al. investigated the trade-off between mesa size and output power of circular-geometry deep UV LEDs, and found that without obtaining more conductive n-type and p-type AlGaN cladding layers, the optimized diameter for circular-disk deep UV LED is limited to about 250 μm [Kim et al., 2004].

DETAILED DESCRIPTION

Though the devices described herein are III-nitride devices, devices formed from other materials such as other III-V materials, II-VI materials, Si are within the scope of embodiments of the invention. The active layers of the devices described herein may be configured to emit UV A (peak wavelength between 340 and 400 nm), UV B (peak wavelength between 290 and 340 nm), or UV C (peak wavelength between 210 and 290 nm) radiation.

Figure 1:
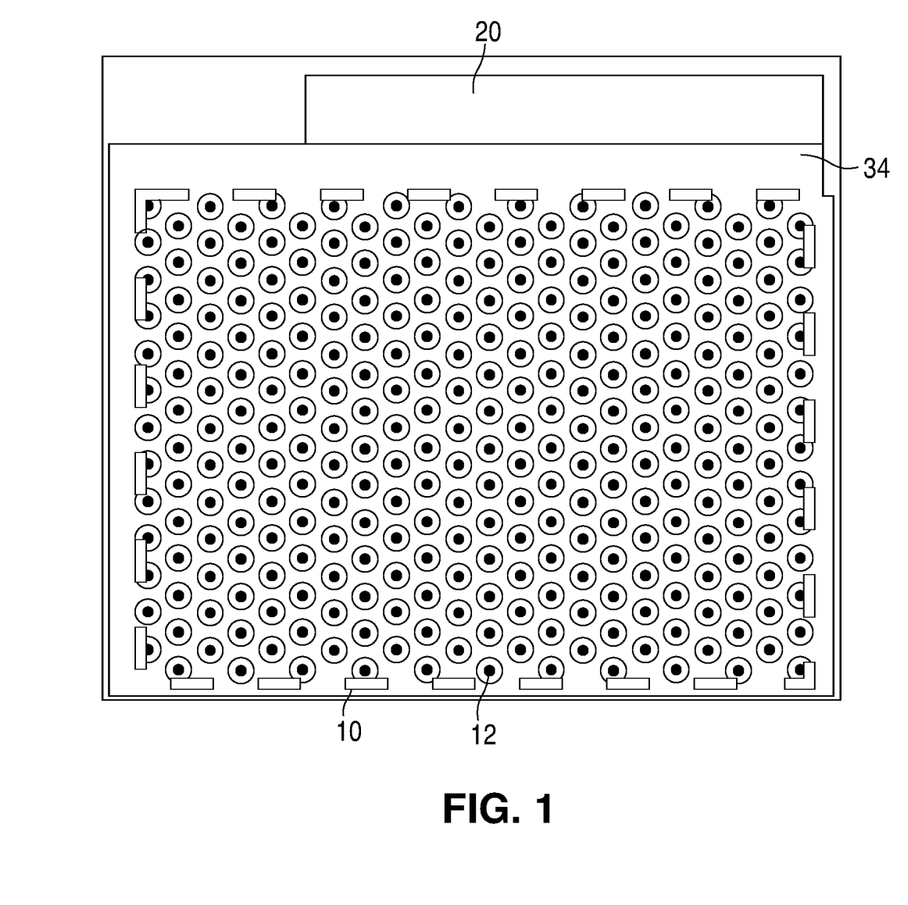
FIG. 1 is a top view of an array of ultraviolet light emitting diode pixels formed on a single substrate.
Figure 2:
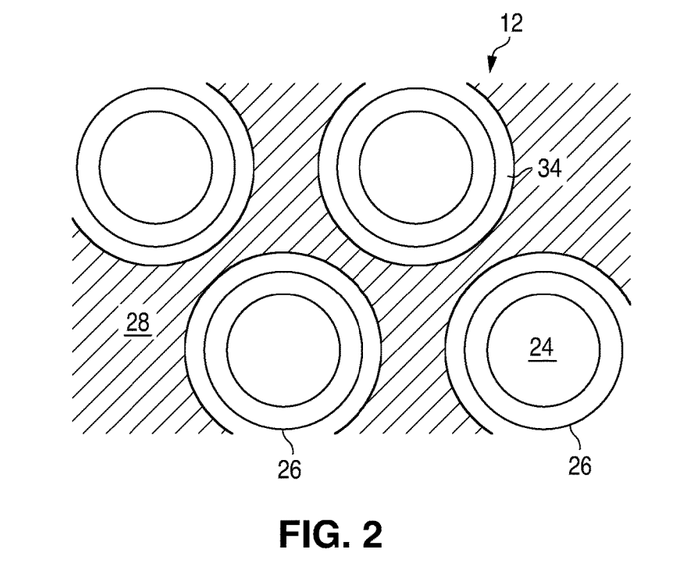
FIG. 2 illustrates four of the pixels illustrated in FIG. 1.
Figure 3:
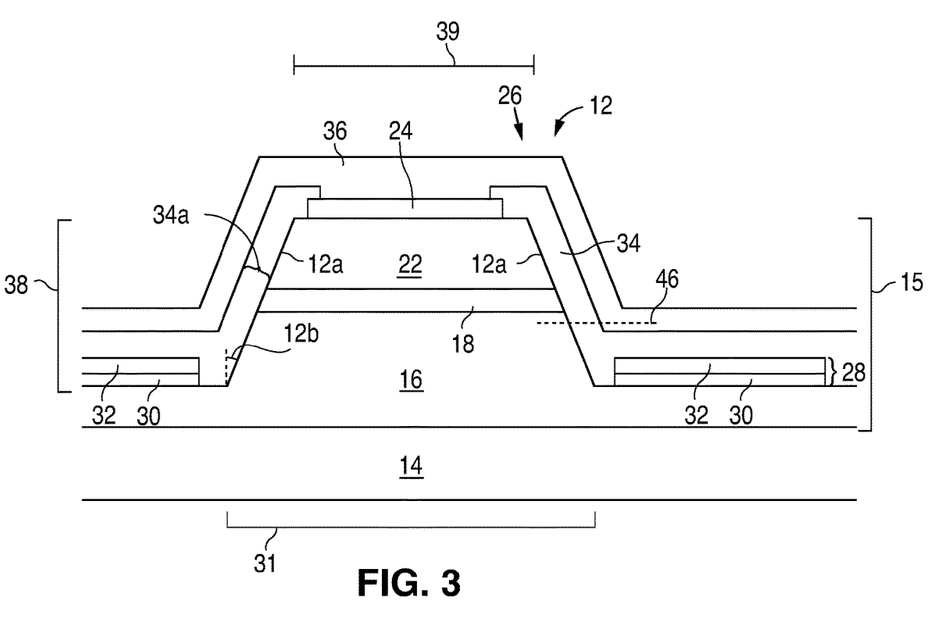
FIG. 3 is a cross sectional view of a single pixel.

FIG. 1 illustrates an array of UV LED pixels formed on a single substrate, according to embodiments of the invention. FIG. 2 illustrates four of the pixels of FIG. 1 in more detail. FIG. 3 is a cross sectional view of one of the pixels.

As illustrated in FIG. 1, an array of pixels 12 is formed on a single substrate. Though the pixels are arranged in a triangular array in the device of FIG. 1, any suitable arrangement of pixels may be used. For example, the pixels 12 may be arranged in a hexagonal array, a square array, any other suitable array, randomly, or in any other suitable arrangement.

Though the pixels 12 are round in FIG. 1, the pixels in any of the devices described herein may be hexagonal, square, rectangular, or any other suitable shape. Though the pixels 12 in FIG. 1 are all the same size and shape, this is not required. Pixels in different parts of the device may have different sizes and/or different shapes.

FIG. 1 illustrates the top of the device. The device may be mounted in a flip chip orientation, such that radiation emitted by each pixel is extracted from the device through the bottom of the device, i.e. the surface of the device opposite the surface illustrated in FIG. 1. FIG. 1 illustrates a p-contact pad 10, which is formed on top of the pixels 12, and an n-contact pad 20 which is located on one edge of the region where the pixels 12 are formed. The p-contact pad 10 is electrically connected to the p-type region of each pixel 12. The n-contact pad 20 is electrically connected to the n-type region of each pixel 12. Electrical and/or physical interconnects such as, for example, solder pads, may be formed in these regions, then used to electrically and physically connect the device to any suitable structure such as, for example, a mount or a printed circuit board.

FIG. 3 is a cross section of one pixel 12. The device may be formed by growing a semiconductor structure 15 on a growth substrate 14. One example of a semiconductor structure 15 is described below. Any suitable semiconductor structure 15 may be used. Embodiments of the invention are not limited to the semiconductor structure described below.

The substrate material should be capable of supporting the epitaxial growth of III-nitrides including AlGaN, and should have high transmission for UV light so that light can be extracted from the bottom of the device through the growth substrate. Suitable substrates include sapphire, c-sapphire, a-sapphire, m-sapphire, r-sapphire, AlN, c-AlN, a-AlN, m-AlN, r-AlN, Si, (001) Si, (111) Si, SiC, c-SiC, a-SiC, m-SiC, r-SiC, ZnO, c-ZnO, a-ZnO, m-ZnO, r-ZnO, and manufactured substrates. The surfaces of the substrate can be smooth, or either surface can be textured to improve light extraction. Sapphire substrates may be nitridated by exposure to ammonia or plasma-activated nitrogen prior to growth of a buffer layer.

The semiconductor structure 15 may be grown by any suitable technique including, for example, epitaxy, vapor phase epitaxy, chemical vapor deposition, metal organic chemical vapor deposition, or molecular beam epitaxy. A buffer layer (not shown) may be grown directly onto the substrate and may contain polycrystalline or non-single crystalline structure (i.e., substantially crystalline material containing some defects or boundaries). The purpose of the buffer layer is to establish a quasi-nitride substrate on which the III-nitride film can be grown under compressive stress with reduced density of threading dislocations and high crystalline quality. The buffer layer can be any III-nitride material, such as AlN, GaN, AlGaN, InAlGaN, or mixtures thereof. AlN is a preferred material for the buffer layer. The buffer layer can have a thickness ranging from about 10 nm to 100 microns. The buffer layer may be somewhat thick compared to visible light LEDs so as to prevent cracking of AlGaN deposited on the buffer layer. The thickness of the buffer layer may be in the range from about 1 micron to about 5 microns. Optionally, a plurality of buffer layers can be used, e.g., 2-3 superimposed buffer layers of the same or different materials, instead of a single buffer layer. High growth temperature for the buffer layer is desired in order to produce good quality AlN epitaxial layers. The temperature range for AlN growth should be in the range of 700° C. to 1200° C. across different epitaxial growth tools.

An n-type region 16 is grown over the buffer layer. The n-type region 16 may include multiple layers of different composition, dopant concentration, and thickness. The n-type region 16 may include at least one $Al_aGa_{1-a}N$ film doped n-type with Si, Ge and/or other suitable n-type dopants. The n-type region may have a thickness from about 100 nm to about 10 microns and is grown directly on the buffer layer(s). The doping level of Si in the n-type region 16 may range from $1\times10^{16}$ cm$^{-3}$ to $1\times10^{21}$ cm$^{-3}$. Depending on the intended emission wavelength, the AlN mole fraction "a" in the formula may vary from 0% for devices emitting at 360 nm to 100% for devices designed to emit at 200 nm. The n-type AlGaN film can also be configured as a multi-layer containing a variety of possible AlGaN layer stacks and stack combinations, including, but not limited to n-AlGaN layers doped at different silicon concentrations and their combinations. The use of a multilayer of n-AlGaN can improve lateral conductivity. In a typical embodiment, a three-layer stack structure is used consisting of n-type $Al_aGa_{1-a}N$ layer doped with silicon to have free electron concentrations of $1\times10^{17}$ cm$^{-3}$, $5\times10^{18}$ cm$^{-3}$, and $1\times10^{19}$ cm$^{-3}$, with corresponding thicknesses of 1 μm, 500 nm, and 300 nm, respectively. Alternatively, n-type region 16 can be doped with gradiently increasing or decreasing Si dopant concentration from, for example, $1\times10^{16}$ cm$^{-3}$ to $1\times10^{21}$ cm$^{-3}$; or it can have a fixed Si dopant concentration but an AlN mole fraction varying from one layer to the next, within the range from 0.0001 to 0.9999. The n-contact metal layers, described below, preferably are formed on the n-AlGaN layer with the highest Si doping. Indium also can be incorporated in the n-AlGaN layer to improve structural quality of the layers and/or to provide strain relief. The total thickness of the n-type region may be in the range from about 500 nm to about 4 microns. All n-type layers described above may be grown under excess Ga conditions, as described in more detail in US 2014/0103289, which is incorporated herein by reference.

An active region 18 is grown over the n-type region 16. The active region may be either a single quantum well or multiple quantum wells (MQWs) separated by barrier layers. The quantum well and barrier layers contain $Al_xGa_{1-x}N/Al_yGa_{1-y}N$, wherein 0<x<y<1, x represents the AlN mole fraction of a quantum well layer, and y represents the AlN mole fraction of a barrier layer. The MQWs start with a first barrier layer $Al_{y1}Ga_{1-y1}N$ (0<y1<1) on top of the n-type region 16, where y1 can have the same, lower, or higher AlN mole fraction than the portion of the n-type region 16 closest to the active region 18, and the thickness of the first barrier layer is from about 0.1 nm to about 100 nm. On top of first barrier layer, a quantum well layer of $Al_{x1}Ga_{1-x1}N$ is grown, with lower AlN mole fraction than the barrier layer; the thickness of the quantum well layer is from about 0.1 nm to about 100 nm. On top of the quantum well layer, another $Al_{y2}Ga_{1-y2}N$ layer is grown as the second barrier layer. The second barrier layer has a higher AlN mole fraction than the quantum well layer, so as to provide quantum confinement (0<x1<y2<1). Y2 can be equal to or less than y1. The thickness of the second barrier is from about 0.1 nm to about 100 nm. In general the last barrier layer is thicker than the first barrier layer. The active region 18 may be grown using excess Ga.

A p-type region 22 is grown over the active region 18 Like the n-type region 16, the p-type region 22 may include multiple layers of different composition, dopant concentration, and thickness. The p-type region 22 may include an electron blocking layer (EBL) adjacent to active region 18. The EBL may have a band gap greater than the barrier layers in active region 18. The EBL is grown with a thickness in the range from about 1 nm to about 30 nm. The EBL may prevent electrons injected from the n-type region 16 into the active region 18 from reaching the p-side of the LED structure. The EBL may be doped p-type or may be undoped, and may be AlGaN or AlN. Following the electron blocking layer, the p-type region 22 includes one or more p-type doped (e.g. Mg-doped) AlGaN layers. The AlN mole fraction can range from 0 to 100%, and the thickness of this layer or multilayer can range from about 2 nm to about 100 nm (single layer) or to about 500 nm (multilayer). A multilayer used in this region can improve lateral conductivity. The Mg doping level may vary from $1\times10^{16}$ cm$^{-3}$ to $1\times10^{21}$ cm$^{-3}$. In one embodiment the AlN mole fraction of an AlGaN layer in the p-type region 22 is half that of the EBL. In another embodiment, p-type region 22 includes an EBL, a p-type AlGaN layer, and a p-type GaN contact layer. In some embodiments, p-type region 22 includes alternating p-AlGaN and p-GaN layers. A Mg-doped GaN contact layer may be grown last in p-type region 22. The Mg doping level can vary from $1 \times 10^{16}$ cm$^{-3}$ to $1 \times 10^{21}$ cm$^{-3}$. P-type region 22 may be grown with excess Ga.

The semiconductor structure 15 is etched to form pixels 12. In the region between pixels, the p-type region 22 and the active region 18 are etched away to form trenches that reveal a surface of the n-type region 16. The sidewall or sidewalls 12*a* of the pixel may be vertical or sloped with an acute angle relative to a major plane of the growth substrate, as illustrated in FIG. 3. The angle 12*b* of the sidewall 12*a* relative to a normal to a major surface of the semiconductor structure 15 may be at least 30° in some embodiments and no more than 60° in some embodiments. The height 38 of each pixel may be at least 0.1 micron in some embodiments, not more than 5 microns in some embodiments, at least 0.5 micron in some embodiments, not more than 2 microns in some embodiments, and 1 micron in some embodiments. The width 39 at the top of each pixel may be at least 5 microns in some embodiments, no more than 50 microns in some embodiments, at least 15 microns in some embodiments, and no more than 25 microns in some embodiments. The width 37 at the bottom of each pixel may be at least 5 microns in some embodiments, no more than 50 microns in some embodiments, at least 15 microns in some embodiments, and no more than 25 microns in some embodiments. The width 39 may be at least 80% of the width 37 in some embodiments, at least 85% of the width 37 in some embodiments, at least 90% of the width 37 in some embodiments, and no more than 100% of the width 37 in some embodiments. The pixels may be shaped as truncated pyramids or cones, as illustrated herein, though this is not required and any suitable shape may be used.

Before or after etching semiconductor structure 15 to form pixels 12, a p-contact 24 is deposited and patterned, such that p-contact 24 is disposed on the top of each pixel 12. P-contact 24 may be a single or multiple metal layers. The p-contact 24 may include one or more metal layers that form an ohmic contact, and one or more metal layers that form a reflector. One example of a suitable p-contact 24 includes a Ni/Ag/Ti multi-layer contact.

An n-contact 28 is deposited and patterned, such that n-contact 28 is disposed on the substantially flat surface of the n-type region 16 between the pixels 12, which was exposed by etching the pixels 12. The n-contact 28 may include a single or multiple metal layers. The n-contact 28 may include, for example, an ohmic n-contact 30 in direct contact with the n-type region 16, and an n-trace metal layer 32 formed over the ohmic n-contact 30. The ohmic n-contact 30 may be, for example, a V/Al/Ti multi-layer contact. The n-trace metal 32 may be, for example, a Ti/Au/Ti multi-layer contact.

The n-contact 28 and the p-contact 24 are electrically isolated by a dielectric layer 34. Dielectric layer 34 may be any suitable material such as, for example, one or more oxides of silicon, and/or one or more nitrides of silicon, formed by any suitable method. Dielectric layer 34 covers n-contact 28. Openings formed in dielectric layer 34 expose p-contact 24. Dielectric layer 34 may extend over the edges of p-contact 24 as illustrated in FIG. 3, though this is not required. Dielectric layer 34 does not completely fill the trench between pixels, as illustrated by cross section 46 which is taken through the pixels in a plane parallel to the growth surface of the substrate, and includes the semiconductor structure 15, the dielectric layer 34 formed on the sidewall of the pixel in the trench between pixels, and the p-trace metal 36 (described below) formed on the dielectric layer 34. Rather, dielectric layer 34 substantially conformally coats the sidewall(s) 12*a* of each pixel 12. For example, the thickness of dielectric layer 34 over the sidewall may vary less than 50% from an average thickness in some embodiments, less than 20% in some embodiments, and less than 10% in some embodiments. The average thickness 34*a* of dielectric layer 34 over the sidewall 12*a* may be at least 0.1 micron in some embodiments, not more than 1 micron in some embodiments, at least 0.3 micron in some embodiments, not more than 0.7 micron in some embodiments, and 0.5 micron in some embodiments.

A p-trace metal 36 is formed over the top surface of the device, and substantially conformally covers the entire top surface. The p-trace metal 36 electrically connects to the p-contact 24 in the openings formed in dielectric layer 34. The p-trace metal 36 extends over n-contact 28 (in a plane parallel to the growth direction), but is electrically isolated from n-contact 28 by dielectric layer 34. The p-trace metal 36 may be a single metal layer or a multi-layer structure, formed by any suitable technique such as, for example, evaporation. The layer of p-trace metal 36 that is closest to p-contact 24 may be a diffusion barrier that prevents or reduces electromigration of metals in the p-contact 24, particularly silver if silver is used as a reflector in p-contact 24. The layer of p-trace metal 36 furthest from p-contact 24 may be selected to adhere to interconnects (such as, for example, solder) used to connect the device to a mount. Examples of suitable multi-layer p-trace metals include Ti/Pt/Au, Ti/Pt/Au/Pt/Au, and Ti/Pt/Au/Ti/Cr/Au.

As described above and illustrated in FIG. 3, the p-trace metal 36 does not fill the trench between pixels, but conformally coats the sidewall 12*a* of each pixel. For example, the thickness of the p-trace metal 36 over the sidewall may vary less than 50% from an average thickness in some embodiments, less than 20% in some embodiments, and less than 10% in some embodiments. The average thickness of the p-trace metal 36 over the sidewall 12*a* may be at least 0.1 micron in some embodiments, not more than 1 micron in some embodiments, at least 0.3 micron in some embodiments, not more than 0.7 micron in some embodiments, and 0.5 micron in some embodiments.

FIG. 2 is a top view of four of the pixels illustrated in FIG. 1. The p-trace metal 36, which covers the entire surface, is omitted for clarity. The p-contact 24 is smaller than and substantially concentric with the edge 26 of the mesa that forms each pixel 12. The n-contact 28 is disposed in the region between the pixels 12. Except for openings in the n-contact 28 to accommodate the pixels, the n-contact 28 forms a continuous sheet, which extends to the edge of the device into n-contact pad 20, illustrated in FIG. 1. The n-contact 28 and p-contact 24 are electrically isolated by dielectric layer 34, which extends over the sidewalls of each pixel, as illustrated in FIG. 3.

Figure 4:
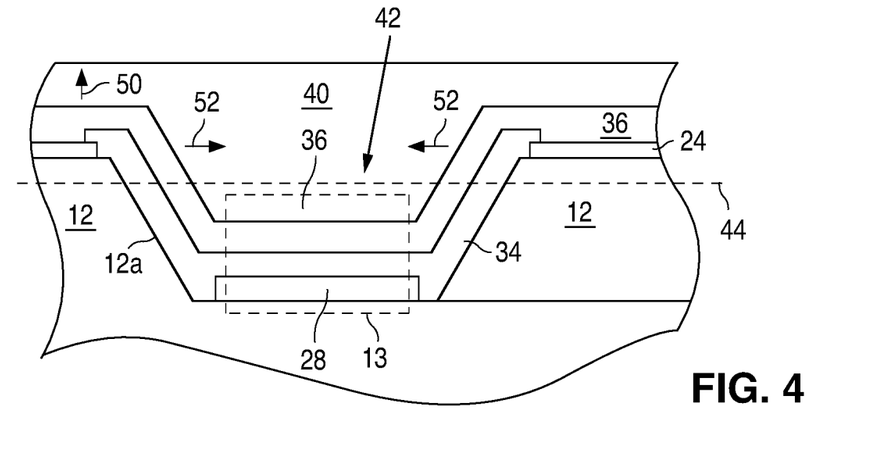
FIG. 4 is a cross sectional view of a region between neighboring pixels.

FIG. 4 illustrates a region between two pixels 12. As described above, both dielectric layer 34 and p-trace metal 36 are substantially conformal layers, which do not fill the trench between the pixels. FIG. 4 illustrates an interconnect 40 disposed over the device. The interconnect 40 is used to electrically and mechanically connect the device to another structure. Solder is often used as interconnect 40 but any suitable material may be used. Interconnect 40 covers the tops of each pixels, and also fills the trench 42 between pixels, such that the top and sidewall(s) of each pixel are surrounded by interconnect 40. For example, cross section 44 is taken through the pixels, in a plane parallel to the growth surface of the substrate (not shown in FIG. 4). Cross section 44 passes through the pixels 12, dielectric layer 34, p-trace metal 36, and interconnect 40, all three of which are disposed in the trench between pixels 12. Interconnect 40 is typically a thermally conductive material. Accordingly, disposing the interconnect 40 adjacent the sidewall(s) of pixel 12 allows heat to be extracted laterally from the semiconductor structure, as illustrated by arrows 52, instead of just vertically from the semiconductor structure, as illustrated by arrow 50.

Forming a device with pixels, instead of a device with a single, large area active region, increases the surface area of the device, which may improve heat extraction from the device. Modeling of heat extraction from the device suggests that when the pixel height (i.e., the height of the semiconductor material in each pixel) is at least 10% of the pixel radius at the top of the pixel, heat extraction from the device may increase at least 20% over a device with a single, large area active region. As the pixel height increases relative to the radius of the pixel, heat extraction may further improve.

As illustrated in FIG. 4, in the bottom of the trench between pixels 12, on a substantially flat surface of the n-type region, the p-trace metal 36, dielectric layer 34, and n-contact 28 are stacked on the n-type region. The stack is illustrated in more detail in FIG. 5. The stack forms a capacitor 13, which may protect the device from electrostatic discharge.

Figure 5:
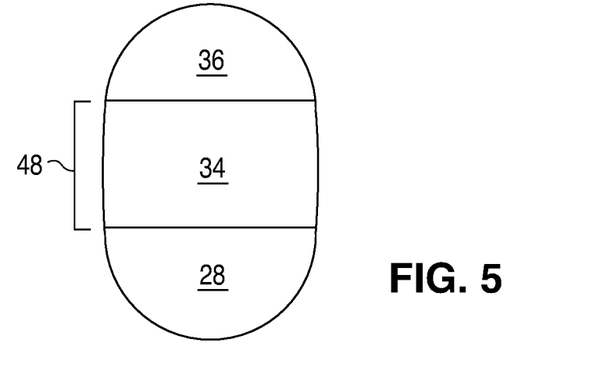
FIG. 5 is a cross sectional view of a capacitor formed by an n-metal layer, a dielectric, and a p-metal layer.

Each of n-contact 28, dielectric layer 34, and p-trace metal 36 may be substantially planar in the region that forms the capacitor 13, such that the capacitor behaves as a parallel plate capacitor. The average thickness 48 of dielectric layer 34 between n-contact 28 and p-trace metal 34 may be at least 0.1 micron in some embodiments, not more than 1 micron in some embodiments, at least 0.3 micron in some embodiments, not more than 0.7 micron in some embodiments, and 0.5 micron in some embodiments.

Figure 9:
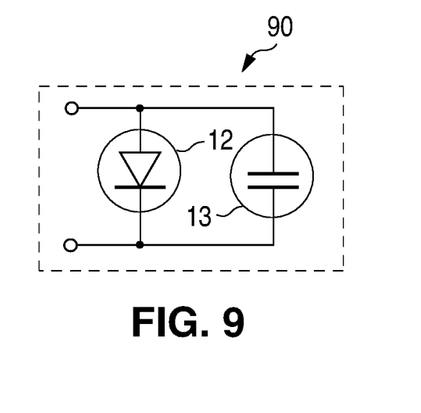
FIG. 9 is a circuit diagram of a pixel and a capacitor formed by metal and dielectric layers near the pixel.
Figure 10:
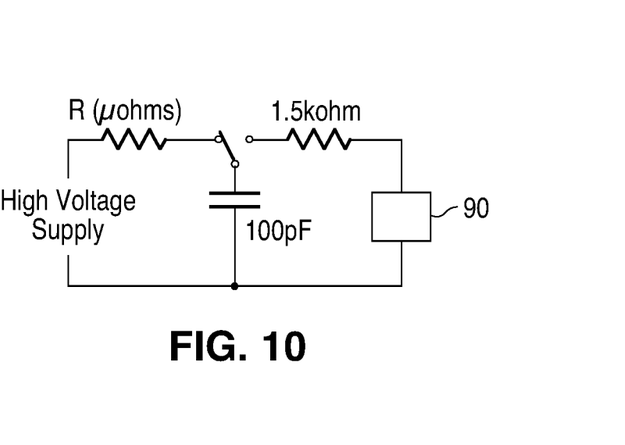
FIG. 10 is a human body model circuit used to evaluate the performance of the circuit illustrated in FIG. 9.

The pixel 12 and the capacitor 13 illustrated in cross section in FIG. 4 are connected in parallel, as illustrated in the circuit diagram shown in FIG. 9. Serial resistance of the circuit illustrated in FIG. 9 may be 100 ohm at steady-state operating drive current. Series resistance of the circuit may be greater than 100,000 ohm during turn-on of the circuit. The behavior of the circuit illustrated in FIG. 9 may be modeled by the human body model (HBM) circuit, a standard and well established model to study electrostatic discharge performance in a circuit. The human body model circuit is illustrated in FIG. 10. HBM modeling indicates that during turn-on of the pixel 12, capacitor 13 may reduce peak current through the pixel 12 by two orders of magnitude, from 2.5 A down to 19 mA under 100,000 ohm series resistance for the circuit of FIG. 9. Under operating drive current, the capacitor 13 has minimal effect.

Figure 6:
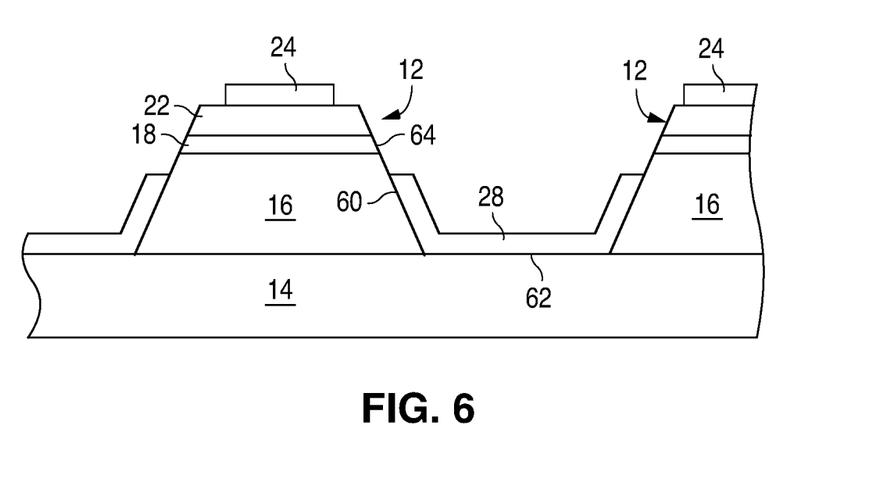
FIG. 6 is a cross sectional view of a region between neighboring pixels, in a device where the etch that defines the pixels extends all the way to the growth substrate.
Figure 7:
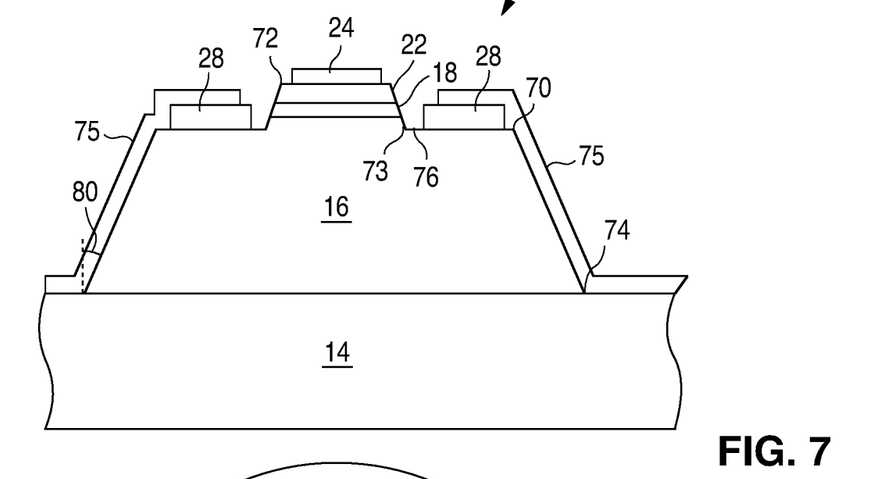
FIG. 7 is a cross sectional view of a pixel including a first, wide mesa including the n-type region, and a second, narrow mesa including the active layer and the p-type region.

In the embodiments illustrated in FIGS. 3 and 4, the etch that forms the pixels terminates on the n-type region 16. In the embodiments illustrated in FIGS. 6 and 7, the etch may remove the entire n-type region, such that it terminates on an insulating layer, such as a buffer layer grown before n-type region 16, or on the substrate 14. In some embodiments, the etch may even remove part of the substrate 14. The etches that form the pixels in FIGS. 6 and 7 are therefore deeper than the etches that form the pixels in FIGS. 3 and 4, which may allow the pixels of FIGS. 6 and 7 to have steeper sidewalls than the pixels illustrated in FIGS. 3 and 4. Steeper sidewalls may increase the amount of light that escapes each pixel through the sidewalls, by reducing total internal reflection. For example, the angle 12b of the sidewall in the device of FIG. 3 may be at least 30° in some embodiments and no more than 60° in some embodiments, as described above. The angle 80 of the sidewall in the device of either FIG. 6 or FIG. 7 may be, for example, at least 10° in some embodiments and no more than 60° in some embodiments.

Dielectric layer 34 and p-trace metal 36 are omitted from FIGS. 6 and 7 for clarity, though the devices illustrated in FIGS. 6 and 7 will include a dielectric layer 34 and a p-trace metal 36.

In the structure illustrated in FIG. 6, a single etch forms the pixels 12. Between the pixels, the entire n-type region is removed. The etch to form the pixels may terminate on the substrate 14, as illustrated in FIG. 6, or on an insulating layer such as a buffer layer, or a single crystal layer grown before the n-type region 16 that is not intentionally doped.

The n-contact 28 may be formed on the side wall 60 of the n-type region 16. For electrical isolation, n-contact 28 does not cover the entire side wall of the pixel 12; rather, n-contact 28 terminates before the sidewall 64 of active region 18. N-contact 28 may extend over the exposed region 62 of substrate between the pixels 12, though this is not required.

In the structure illustrated in FIG. 7, the pixels 12 are formed in two etching processes, such that two mesas are formed. In one etching process, the semiconductor material between pixels 12 is removed. This etch may terminate on an insulating layer, such as a buffer layer grown before n-type region 16, or the substrate 14. In the other etching process, at the top of the pixel, a portion of the p-type region 22 and active region 18 are removed to expose a portion 76 of the n-type region. The exposed portion 76 of the n-type region may surround the remaining portion of the active region 18 and p-type region 22, though this is not required. The n-contact 28 is formed on the exposed portion 76 of the n-type region. The n-contact 28 may extend over the edge 70 of the n-type region 16 and on to the sidewall 78 of the pixel 12, though this is not required. A metal layer 75 may be disposed on the n-contact 28, over the sidewalls of the pixel, and in the region between the pixels 12, for example on the surface of the substrate 14 (or whichever surface is exposed by the etching process described above). Metal layer 75 may be the same material as n-contact 28, or a different material. In some embodiments, n-contact 28 includes Al and the metal layer 75 includes Au. The metal layer 75 may extend to the side of the chip to form an n-pad for soldering, as illustrated in FIG. 1.

Figure 8:
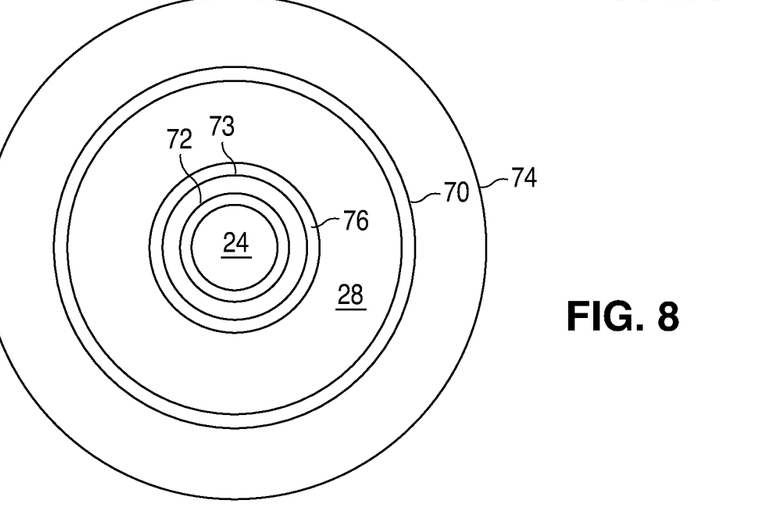
FIG. 8 is a top view of the pixel illustrated in FIG. 7.

FIG. 8 is a top view of the pixel illustrated in FIG. 7. The p-contact 24 is at the center of the figure, disposed on a first mesa. The edge of the top of the first mesa is defined by ring 72. The diameter of the first mesa (ring 72) may be at least 5 microns in some embodiments, no more than 30 microns in some embodiments, at least 10 microns in some embodiments, and no more than 20 microns in some embodiments. The bottom of the first mesa is defined by ring 73. The n-contact 28 is disposed on a second mesa, the top of which is defined by rings 73 and 70. The bottom of the second mesa is defined by ring 74. The diameter of the second mesa (ring 70) is at least 12 microns greater than the diameter of the first mesa, in some embodiments. The diameter of the second mesa may be at least 15 microns in some embodiments, no more than 45 microns in some embodiments, at least 20 microns in some embodiments, and no more than 30 microns in some embodiments. Larger second mesas may improve light extraction from the pixel. Both the first and second mesas have sloped sidewalls, such that the bottom of each mesa is wider than the top.

Having described the invention in detail, those skilled in the art will appreciate that, given the present disclosure, modifications may be made to the invention without departing from the spirit of the inventive concept described herein.

In particular, different features and components of the different devices described herein may be used in any of the other devices, or features and components may be omitted from any of the devices. Therefore, it is not intended that the scope of the invention be limited to the specific embodiments illustrated and described.

What is being claimed is:

1. A light emitting device comprising:
   a first semiconductor layer grown over a growth substrate;
   a plurality of discrete semiconductor regions disposed on the first semiconductor layer, each discrete semiconductor region comprising an active layer disposed between an n-type region and a p-type region;
   trenches isolating individual discrete semiconductor regions and forming at least one sidewall for each discrete semiconductor region, the at least one sidewall comprising:
      a first portion defining a first mesa, the first portion extending through the active layer into the n-type region;
      a second portion defining a second mesa; and
      a substantially flat area disposed between the first and second portions;
   a first metal layer in direct contact with the p-type region on a top surface of each discrete semiconductor region;
   a second metal layer in direct contact with the n-type region, the second metal layer being confined to the substantially flat area;
   a third metal layer in direct contact with the second metal layer and disposed on the second portion; and
   an electrically and thermally conductive material that fills the trenches between the individual discrete semiconductor regions so that the conductive material is in direct contact with the at least one sidewall of the first mesa and the second mesa, the conductive material filling the trenches prior to the device being attached to a mount, the conductive material being configured for attachment to the mount, wherein a cross section taken through the discrete semiconductor regions and the trenches parallel to a major surface of the growth substrate includes the conductive material.

2. The device of claim 1 wherein a width of each discrete semiconductor region is at least 5 microns and no more than 50 microns.

3. The device of claim 1 wherein a height of each discrete semiconductor region is at least 0.1 micron and no more than 5 microns.

4. The device of claim 1 wherein the discrete semiconductor regions are arranged in an array.

5. The device of claim 1 wherein the conductive material extends along the sidewalls of the discrete semiconductor regions.

6. The device of claim 1 wherein the active layer of each discrete semiconductor region is $Al_xGa_{1-x}N$, wherein x>0.

7. The device of claim 1 wherein the second metal layer comprises aluminum and the third metal layer comprises gold.

8. The device of claim 1 wherein the second and third metal layers are different.

9. The device of claim 1 wherein the first portion and the second portion form an acute angle with a major surface of the growth substrate.

10. The device of claim 1 wherein the second portion extends to the growth substrate.

11. A light emitting device comprising:
    a plurality of pixels disposed on a growth substrate, each pixel comprising a III-nitride active layer disposed between an n-type region and a p-type region;
    trenches isolating individual pixels and forming at least one sidewall for each pixel; and
    solder disposed in the trenches between the individual pixels and in direct contact with the at least one sidewall of the pixels wherein, within the trenches, the solder is in direct contact with a metal layer disposed on the at least one sidewall prior to the device being attached to a mount, and wherein a cross section taken through the pixels and the trenches parallel to a major surface of the growth substrate includes the solder.

12. The device of claim 11 wherein each sidewall forms an acute angle with a plane parallel to a major surface of the growth substrate.

13. The device of claim 11 wherein the pixels are rectangular.

14. The device of claim 11 wherein the trenches end in the n-type region.

15. The device of claim 11 wherein the trenches end at or in the growth substrate.

16. The device of claim 11 wherein the second metal is not formed on the at least one sidewall and is confined to the bottom of the trench.

17. The device of claim 11 further comprising:
    a first metal layer in direct contact with the p-type region on a top surface of each pixel;
    a second metal layer in direct contact with the n-type region on the bottom of a trench adjacent to each pixel;
    an insulating layer electrically isolating the first and second metal layers, wherein the insulating layer is disposed on the sidewall of each pixel and is substantially conformal to the sidewall.

18. The device of claim 17 further comprising a third metal layer electrically connected to the first metal layer, wherein the third metal layer extends over the sidewall of each pixel and over the second metal layer.

19. The device of claim 18 wherein a thickness of the insulating layer between the second metal layer and the third metal layer is at least 0.1 micron and no more than 1 micron.

20. The device of claim 18 wherein the second metal layer, the insulating layer, and the portion of the third metal layer form a parallel plate capacitor.

* * * * *